United States Patent [19]
Lathrop

[11] 3,991,363
[45] Nov. 9, 1976

[54] METHOD AND APPARATUS FOR DETECTING FAULTS IN BURIED INSULATED CONDUCTORS

[75] Inventor: Thomas Virgil Lathrop, Jamestown, N.C.

[73] Assignee: Bell Telephone Laboratories, Incorporated, Murray Hill, N.J.

[22] Filed: Aug. 11, 1975

[21] Appl. No.: 603,278

[52] U.S. Cl. .................................. 324/52; 324/54; 324/67
[51] Int. Cl.² .................. G01R 31/08; G01R 31/28
[58] Field of Search .................... 324/52, 66, 67, 54

[56] References Cited
UNITED STATES PATENTS

| | | | |
|---|---|---|---|
| 1,672,933 | 6/1928 | Edwards et al. ...................... | 324/52 |
| 2,176,755 | 10/1939 | Borden ................................. | 324/52 |
| 2,176,757 | 10/1939 | Borden ................................. | 324/52 |
| 2,425,554 | 8/1947 | Nelson et al. .......................... | 324/52 |
| 2,641,633 | 6/1953 | Hosford ................................. | 324/52 |
| 2,731,598 | 1/1956 | Herbert ................................. | 324/52 |
| 2,966,627 | 12/1960 | Hawkins ................................ | 324/1 |
| 3,299,351 | 1/1967 | Williams .............................. | 324/52 |
| 3,526,831 | 9/1970 | Smith ................................ | 324/52 X |
| 3,792,350 | 2/1974 | Bossler et al. ........................ | 324/52 |

*Primary Examiner*—Gerard R. Strecker
*Attorney, Agent, or Firm*—H. L. Logan

[57] ABSTRACT

An electrical leakage path fault in the insulation of a buried conductor is located by first applying a composite signal comprising a test signal and a carrier signal modulated by the test signal between the conductor and earth. The two components of the composite signal are then sensed at locations along the path of the conductor. The sensed carrier signal is used by itself while its modulation content is used with the sensed test signal to trace the conductor to the fault.

10 Claims, 7 Drawing Figures

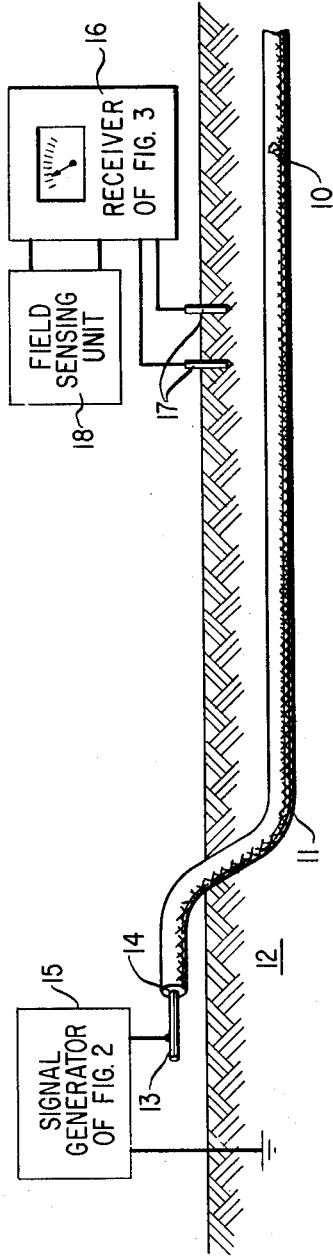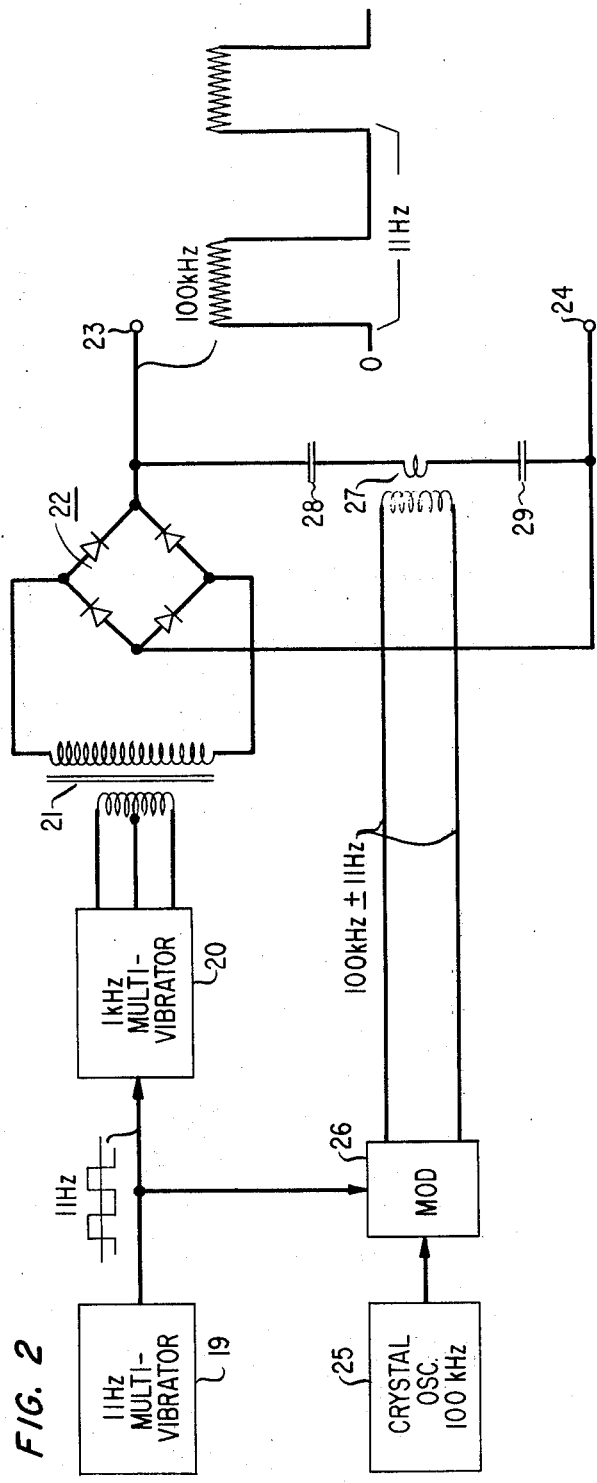

METHOD AND APPARATUS FOR DETECTING FAULTS IN BURIED INSULATED CONDUCTORS

BACKGROUND OF THE INVENTION

1. Field of the Invention

This invention relates to tracing buried conductors to locate conductor-to-earth leakage paths through the insulation of the buried conductors.

2. Description of the Prior Art

Telephone and electrical power lines are frequently buried in the earth for esthetic reasons and to reduce exposure to physical damage. These lines, however, do not always remain free of physical damage. The insulating material on a buried wire, for example, may be damaged during installation or as a result of earth shifting, rodent attack, or deterioration. When damage of this sort occurs, moisture in the earth often penetrates the insulation to provide a leakage path between the wire and the earth. On the other hand, when one or more wires are encased in a metallic sheath covered by insulating material, similar damage to this material often results in a leakage path between the metallic sheath and the earth. In either case, an electrical leakage path is provided between a metallic conductor and the earth which may have adverse effects on the intended function of the buried lines.

One technique for locating a fault of the above-described type applies an alternating test signal between the conductor and the earth and then uses a pair of earth probes to localize the fault by sensing the voltage gradient in the earth return path. This is explained in detail in "Locating Cable Faults," by Charles A. Maloney, pp. 380–394 in *IEEE Transactions on Industry Applications*, Vol. 1A-9, No. 4, July/August 1973.

With the above-mentioned technique, a phase reversal in the sensed voltage takes place as the probes traverse the fault. This is used to advantage in a prior art pulsed DC arrangement which detects the magnitude and polarity of probe detected pulses.

U.S. Pat. No. 3,299,351, issued Jan. 17, 1967, to D. L. Williams, discloses apparatus which uses to advantage the phase reversal that takes place at the fault. This apparatus adds a second signal at one-half the frequency of the test signal to the test signal before it is applied to the conductor. Both signals are sensed in the earth return path and separated from one another. The lower frequency signal is squared and then the second harmonic component is extracted and used as a reference signal. The phasal relationship between the detected test signal voltage gradient and the reference signal is indicative of the direction of the fault.

SUMMARY OF THE INVENTION

An object of the present invention is to reduce the time require to locate a fault in a buried insulated conductor.

This and other objects are achieved by adding a second signal in the form of a modulated carrier signal to the alternating test signal which is normally applied in the earth return technique. In particular, this second signal comprises a carrier signal modulated by the test signal. The components of the composite signal thus produced are sensed at discrete locations along the path of the buried conductor. An indication relative to the amplitude of the carrier wave is produced for conductor tracing use. A reference signal is also produced from the modulation content of the modulated carrier signal. The reference signal is used in conjunction with the sensed test signal component to determine the direction of a fault in the conductor.

When practicing the invention, the frequency of the carrier frequency is selected at least high enough so that the modulation content of the modulated carrier is adequate to produce a reasonable facsimile of the test signal. The second signal therefore has a frequency greater than the alternating rate of the test signal, which is twice the alternating rate of the second signal in the aforementioned prior art arrangement. As a consequence, coupling between the conductor and earth is greater along the length of the conductor (i.e., it is not concentrated at the fault). Greater coupling in the conductor-to-earth path results in an increased current for the second signal. This increases the voltage gradient in the earth and also increases the strength of a magnetic field established above the surface of the earth by this current.

The increased magnetic field permits antenna coils located above the surface of the earth to be used to sense the modulated carrier signal. In one embodiment of the invention, the path of a buried conductor is quickly traced by following the path which produces a null output from a vertically oriented coil. Furthermore, a strong and consistent reference signal is derived from the modulation content of the sensed modulated signal. This reference signal, as in the Williams patent, is phase compared with the sensed test signal component to determine the direction of the fault.

These and other features of the invention will become more apparent from the following description of a specific embodiment.

BRIEF DESCRIPTION OF THE DRAWINGS

In the drawings:

FIG. 1 shows a block diagram of an embodiment of the invention in place for locating a fault in the insulation of a buried conductor;

FIG. 2 shows a block diagram of a generator which may be used in practicing the invention;

DETAILED DESCRIPTION

Figure 3:
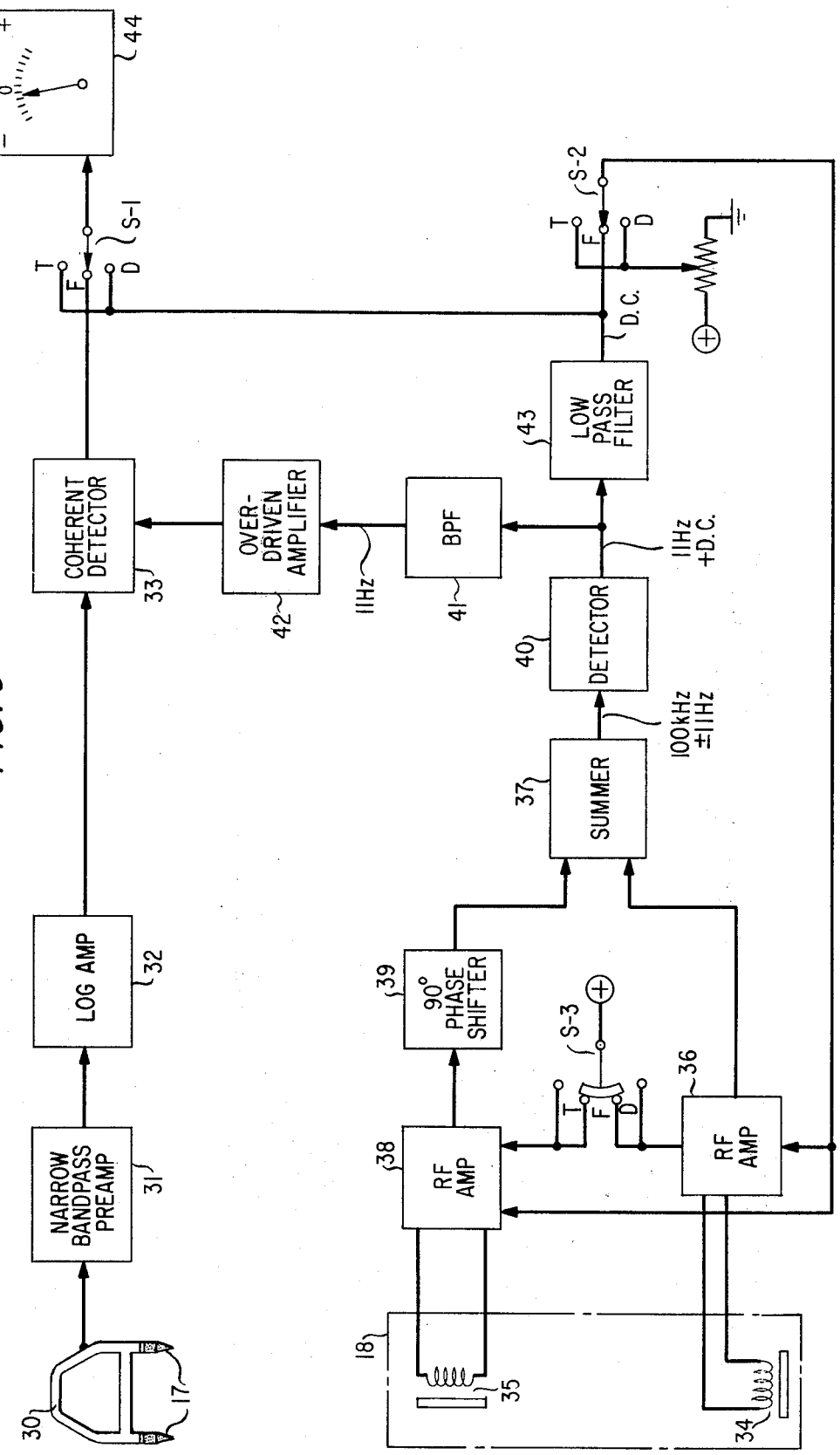
FIG. 3 shows a block diagram of a receiver which may be used in practicing the invention.

FIG. 1 shows an embodiment of the invention in place for locating a fault in the insulation material on a buried transmission line. In particular, FIG. 1 shows a fault 10 in a transmission line 11 which is buried in earth 12. Line 11 comprises a conductor 13 surrounded by insulation material 14. Line 11 may be, for example, a single insulated wire, a group of insulated wires which are in turn encased in a metallic sheath covered by insulating material, or a coaxial cable where the outer conductor comprises a metallic sheath covered by insulation material. In the first-mentioned example, conductor 13 comprises the wire while in the last two mentioned examples conductor 13 comprises the metallic sheath. Fault 10, on the other hand, results from a defect of some form in insulation material 14 to provide a leakage path between conductor 13 and earth 12.

In accordance with the invention, a generator 15 applies a composite signal between conductor 13 and earth 12. This may, for example, take place at some point prior to line 11 going below the surface of earth 12. This composite signal comprises two signals. The first of these signals is a conventional alternating test signal used in the prior art for locating faults by tracking voltage gradients in the earth through the use of a pair of earth probes. In particular, this signal alternates at a rate low enough so that most of its energy travels in a path including the leakage path at the fault; that is, the alternating rate is low enough so that the effect of the capacitive coupling between conductor 13 and earth 12 along the length of line 11 does not mask the effect of the leakage path provided at fault 10.

The second signal, on the other hand, alternates at a rate high enough so that most of its energy travels in a path including the capacitive coupling between conductor 13 and earth 12; that is, the alternating rate is high enough so that the effect of the capacitive coupling masks the effect of the leakage path provided at fault 10. Furthermore, the second signal is modulated at the alternating rate of the first signal. This relationship between the two signals will be further appreciated in a later presented discussion relating to the specific composite signal generator disclosed in FIG. 2.

FIG. 1 also shows a receiver 16 having a first input signal derived from a pair of earth probes 17 and second and third input signals derived from field sensing unit 18. Probes 17 are used to sense the earth voltage gradient while unit 18 is used to sense the electromagnetic field above the surface of earth 12. Receiver 16 produces an indication of the amplitude of the modulated signal sensed by unit 18 and, furthermore, develops from the modulation content of this signal a reference signal for determining the phase of the probe sensed signal. The operation of receiver 16, probes 17, and unit 18 will be further appreciated in a later discussion relating to specific apparatus disclosed in FIG. 3.

FIG. 2 shows, in block diagram form, a generator which may be used as generator 15 of FIG. 1. The low alternating rate signal produced by this generator alternates between a zero level and some predetermined level at an 11 Hz rate and with a 50 percent duty factor. This is produced by an 11 Hz free-running multivibrator 19 whose symmetrical output gates on and off a 1 kHz free-running multivibrator 20. The output of multivibrator 20 is applied via a transformer 21 to a full-wave rectifier 22. The output from rectifier 22 appears between a pair of output terminals 23 and 24. (In many applications the output of multivibrator 20 should be amplified so as to produce an output signal of a required level. For purposes of simplification, amplifiers required just for gain purposes have not been shown in FIGS. 2, 3, 6, and 7.)

The higher alternating rate signal is produced by a 100 kHz crystal oscillator 25 whose output is modulated in a modulator 26 by the output of multivibrator 19. The double sideband (100 kHz ± 11 Hz) output of modulator 26 is applied to output terminals 23 and 24 by way of a transformer 27 and a pair of capacitors 28 and 29. (The test sigal, because it is a square wave, comprises a plurality of frequency components; the term "11 Hz" should be viewed accordingly.) The 11 Hz signal applied to modulator 26 is phased so that the 100 kHz signal is on when the low repetition rate signal is positive, and off when that signal has a zero value. This is illustrated by the composite waveform sketch shown adjacent to terminal 23.

FIG. 3 shows, in block diagram form, a receiver which may be used when practicing the embodiment of FIG. 1. This particular receiver, when used in the embodiment of FIG. 1, permits a craftsman to trace a buried conductor, to locate a fault, and to determine the depth of the conductor. In particular, the receiver includes a three-section, three-position switch S. The three sections are identified as S-1, S-2, and S-3 and are shown separated from one another for diagrammatic simplicity. It should be understood, however, that the wiper arms on the three sections all move in unison. The wiper arms of sections S-1 and S-2 make electrical contact with only one contact, respectively, at a time while the wiper arm of S-3 applies a DC potential to two contacts at a time. Starting with the most clockwise position and proceeding to the most counterclockwise position, the three positions are identified as T, F, and D, which stand for Trace, Fault, and Depth, respectively.

Earth probes 17 are shown in FIG. 3 as being affixed to a handle structure 30 which facilitates in placing the probes in the earth at a fixed space-apart relationship. The voltage gradients sensed by probes 17 are applied to a conventional narrow bandpass preamplifier 31 which serves to separate the desired low repetition rate signal from what otherwise comprises noise. The output of preamplifier 31 is then applied to a conventional logarithmic amplifier 32 which enables a dynamic range of 100 decibels to be achieved. The output of amplifier 32 is applied as one input to a coherent detector 33. The output of detector 33 is applied to the F contact of switch section S-1. Another input to detector 33 is provided by a second "channel" which will now be discussed.

The 100 kHz ± 11 Hz signal which forms a part of the composite signal applied to the buried conductor is radiated along the path of the conductor (as a result of capacitive coupling) with sufficient strength so that an electromagnetic field above the surface of the earth may be sensed. This sensing is achieved by vertical antenna coil 34 and horizontal antenna coil 35 in unit 18. The output of coil 34 is amplified by r.f. amplifier 36 (when energized) and applied to a summer 37. The output of coil 35 is amplified by an r.f. amplifier 38 (when energized), phase shifted 90° by a phase shifter 39, and applied to summer 37.

The output of summer 37 is applied to a detector 40. The output of detector 40 is applied to a narrow bandpass filter 41 to recover the 11 Hz modulating signal. The recovered modulating signal is waveshaped in overdriven amplifier 42 and then applied to coherent detector 33. The output of detector 40 is also filtered in a lowpass filter 43 and then applied to the F contact of switch section S-2. Contacts T and D of switch section S-2 are connected to a DC voltage source. When the wiper arm of switch section S-2 is in contact with contact F, amplifiers 36 and 38 are operating as automatic gain controlled (AGC) amplifiers. On the other hand, they operate as fixed gain amplifiers when the wiper arm of section S-2 is in contact with either of contacts T of D. Finally, the wiper arm of switch section S-1 is connected to a zero-centered meter 44.

Figure 4:
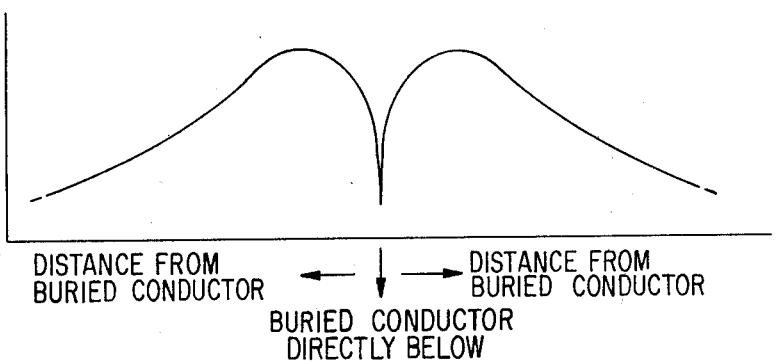
FIG. 4 and 5 are plots of signal strength versus displacement for vertical and horizontal antenna coils, respectively, above an energized buried conductor.

With the composite signal applied to a buried conductor and switch S in its T position, amplifier 38 is energized and has a fixed gain. The level variation of the sensed modulated signal (and, consequently, the DC output of detector 40 and the deflection of meter 44) as unit 18 is moved from one side of the buried conductor to the other side of the conductor is shown in FIG. 4. It should be noted that a null appears when unit 18 is substantially directly above the buried cable. The path of the conductor is traced by walking along the path which keeps the meter in a null-indicating state. (The output of coil 34 could also be used for tracing purposes. Vertical coil 33 is, however, preferred because the null produces a better defined path.)

Figure 5:
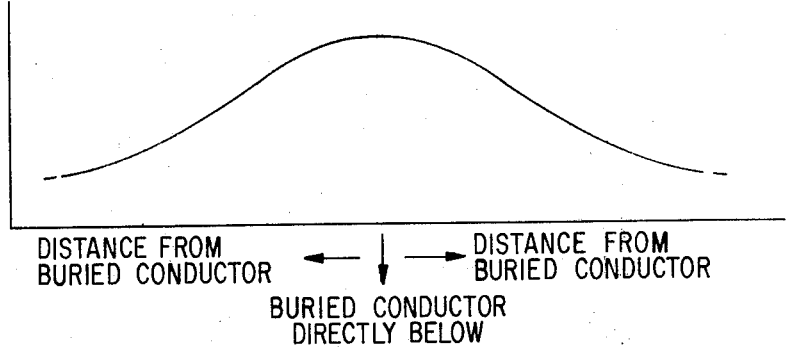

To determine the depth of a buried conductor energized in accordance with the invention, switch S is placed in its D position. At this time amplifier 36 is energized and has a fixed gain. The level variation of the sensed modulated signal (and, consequently, the DC output of detector 40 and the deflection of meter 44) as unit 18 is moved at a fixed height above the earth from one side of the buried conductor to the other side of the conductor is shown in FIG. 5. As unit 18 is brought closer to the earth's surface, the deflection of meter 44 increases. Conversely, as unit 18 is moved farther away from the earth's surface, the deflection of meter 44 decreases. In particular, the voltage reading on meter 44 decreases by 6 decibels when the conductor-to-unit distance is doubled. Therefore, the vertical distance unit 18 must be moved from the surface of the earth in order to obtain a 6 decibel decrease in the voltage reading is the distance the conductor is below the surface of the earth.

In the disclosed receiver, determining the direction of the fault is achieved by placing switch S in its F position. At this time amplifiers 36 and 37 are both energized and are automatic gain controlled (AGC) by the output of lowpass filter 42. When in the general vicinity of a buried cable energized in accordance with the invention, a null output can be produced by summer 37 only when vertical coil 35 is directly above the buried conductor and horizontal coil 34 is parallel to the buried conductor. This, however, is an extremely unique position for unit 18 and, because the unit is far removed from this position in its normal use, the positioning of unit 18 in the general vicinity of the energized conductor is not critical in order to be assured an output from summer 37. This results in a constant, relatively noise-free reference signal being applied to coherent detector 33 by overdrive amplifier 42.

Locating the fault is achieved by moving probes 17 along the path of a buried energized conductor until the signal detected by the probes changes phase. In particular, on one side of fault, the low repetition rate signal sensed by probes 17 is in phase with the reference signal applied to coherent detector 33 by overdriven amplifier 42 while, on the other side of the fault, the sensed low repetition rate signal is 180° out of phase with the reference signal. The output from coherent detector 33 drives the needle of meter 44 to one side of its center position for an in-phase condition and to the other side of its center position for an out-of-phase condition. By maintaining probes 17 in a particular order with respect to generator 15, the direction of the needle deflection of meter 44 is indicative of which side of the fault the probes are located. When probes 17 straddle the fault, meter 44 produces a zero indication.

It should be understood that embodiments of the present invention do not require both vertical and horizontal antenna coils. In particular, one embodiment of the invention utilizes the receiver of FIG. 3 with coil 34, amplifier 36, shifter 39, and summer 37 eliminated and with amplifier 38 feeding directly into detector 40. When arranged in this manner, depth measurements cannot, of course, be made as described; however, tracing can be performed as explained before and a reliable reference signal can be developed within the receiver by maintaining coil 35 slightly to one side of the path of the buried conductor.

It should also be understood that practicing the invention is not restricted to an alternating test signal which is a unipolar square wave. This test signal may, for example, comprise a sine wave.

Figure 6:
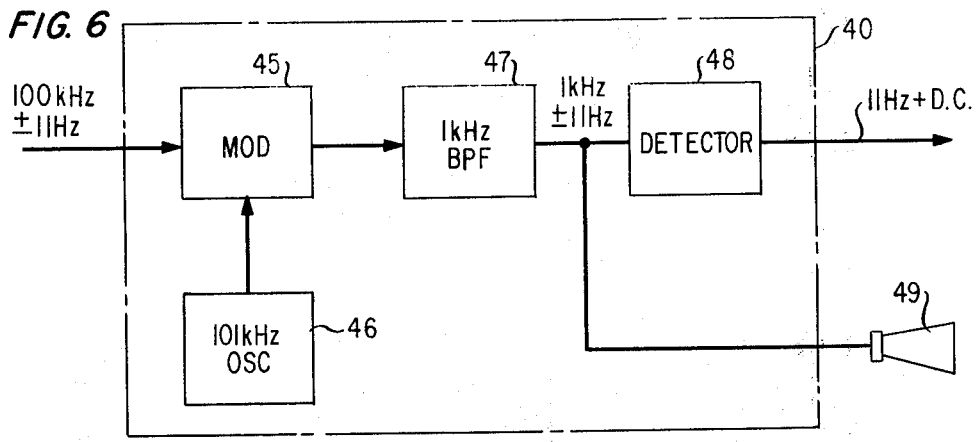
FIG. 6 shows a particular detector which may be used in the receiver shown in FIG. 3.

Tracing the path of a buried conductor may often be more rapidly achieved by adding audio means to identify the null shown in FIG. 4. One way in which this may be accomplished is by letting detector 40 take the form shown in FIG. 6. As shown in FIG. 6, the 100 kHz ± 11 Hz input to detector 40 is applied to a modulator 45 which also receives the output of a 101 kHz oscillator 46. The output of modulator 45 is passed through a 1 kHz bandpass filter 47 to filter out a 1 kHz ± 11 Hz signal. This signal is applied to a detector 48 to produce the 11 Hz plus DC output of detector 40 and also to an audio device 49. Variations in the audio output of device 49 are identical to the output level variations of detector 40 as shown in FIG. 4.

Still another way of producing an audio output for use in tracing is to use a higher frequency modulating signal in generator 15 during the tracing operation. A switch from the output of multivibrator 19 to the output of multivibrator 20 during the tracing operation, for example, achieves this purpose. The output of detector 40 under these conditions is 1 kHz ± 11 Hz plus a DC component. An audio unit connected to the output of detector 40 responds by producing an audio output which varies in intensity in accordance with FIG. 4. Furthermore, as appreciated by those skilled in the art, a separate oscillator may be added to generator 15 to provide an audio modulating signal for tracing purposes.

Figure 7:
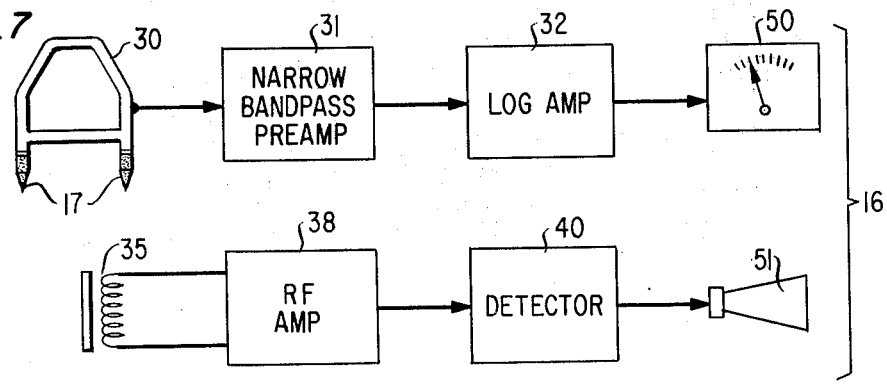
FIG. 7 shows another receiver which may be used when practicing the invention.

Finally, the invention may be practiced in a manner whereby a coherent detector is not required in the receiving equipment. In particular, the invention has been practiced by using the output of multivibrator 20 (FIG. 2) as the modulating signal and feeding the outputs of amplifier 32 and detector 40 (FIG. 3) into respective indicating devices (e.g., speakers and meters). In this configuration, the alternating rate of the test and modulating signal is selected at a low enough value to permit an operator to distinguish either simultaneous or alternating outputs from the indicating devices. This is shown in FIG. 7 wherein amplifier 32 feeds into a meter 50 and detector 40 feeds into an audio unit 51. Conductor path tracing is accomplished by following the path which produces the minimum output from audio unit 51. Pinpointing of a fault is achieved by noting the deflections of meter 50 while listening to the output from audio unit 51 produced when coil 35 is displaced from directly over the buried conductor. The meter deflections occur either in phase with or out of phase with sounds from audio unit 51. By maintaining probes 17 in a particular order with respect to generator 15, the in-phase or out-of-phase character of the meter indications and the audio sounds is indicative of the direction of the fault. A zero indication is produced by meter 50 when probes 17 straddle the fault.

What is claimed is:

1. In a system for tracing buried conductors to locate conductor-to-earth leakage paths through the insulation of the buried conductors wherein said system comprises first means for applying a composite signal comprising an alternating test signal and a second signal between a conductor of a buried insulated conductor and the medium in which it is buried, and second means for sensing said composite signal at discrete locations along the path of said conductor and for deriving a reference signal from the second signal portion of said sensed signal where said reference signal alternates at the same rate as said test signal, an improvement in said system characterized in that,
said second signal applied by said first means comprises a carrier signal modulated by said test signal, and
said second means utilizes the modulation content of said second signal portion of said sensed signal to derive said reference signal.

2. A system in accordance with claim 1 in which said second means comprises
third means which may be positioned in the magnetic field produced by said second signal flowing in said conductor to sense energy therein and provide a signal substantially identical in character to said second signal, and
fourth means responsive to the last-mentioned signal to extract the modulation portion thereof derive said reference signal.

3. A system in accordance with claim 2 which system further comprises
fifth means to produce an indication related to the amplitude of said last-mentioned signal.

4. A system for tracing buried conductors to locate conductor-to-earth leakage paths through the insulation of the buried conductors, said system comprising
first means for simultaneously applying an alternating test signal and a second signal in the form of a carrier signal modulated by said test signal between a conductor of a buried insulated conductor and the medium in which it is buried,
second means for separately sensing said test signal and said second signal at discrete locations along the path of said conductor, and
third means for deriving a reference signal from the modulation content of said sensed second signal, which reference signal alternates at the same rate as said test signal and which may be compared phasewise with said sensed test signal.

5. A system in accordance with claim 4 in which said second means comprises
an antenna coil assembly comprising at least one vertical antenna coil for sensing said second signal, and
a pair of probes adapted for insertion into the earth to measure voltage gradients therein for sensing said test signal.

6. A system in accordance with claim 5 which further comprises
means for producing an indication related to the amplitude of the sensed second signal.

7. A system in accordance with claim 6 which further comprises
a coherent detector respective to said sensed test signal and said reference signal, and
means responsive to said detector to produce an indication related to the level of its output.

8. A system in accordance with claim 6 which further comprises
means to produce an indication related to the amplitude of said sensed test signal.

9. A method for locating an electrical leakage path through insulating material surrounding an elongated conductor buried in a conducting medium, said method comprising the steps of:
applying simultaneously an alternating test signal and a carrier signal modulated by said test signal between said conductor and said medium;
separately sensing said test signal and said modulated carrier signal at discrete locations along the path of said conductor;
deriving a reference signal from the modulation content of said sensed modulated carrier signal;
determining whether said sensed test sigal and said reference signal are in an in-phase relationship or an out-of-phase relationship; and
selecting said discrete locations until two adjacent locations are found where said relationships change from one to the other, whereby said leakage path is located as between said two adjacent locations.

10. A method in accordance with claim 9 which further comprises the step of
tracing the path of said conductor by measuring the amplitude of said sensed modulated carrier signal.

* * * * *